United States Patent
Totani

(10) Patent No.: US 10,101,522 B2
(45) Date of Patent: Oct. 16, 2018

(54) PLANAR LIGHT SOURCE AND METHOD FOR PRODUCING LIGHT-EMITTING DEVICE

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD, Kiyosu-Shi, Aichi-Ken (JP)

( * ) Notice: Subject to any disclaimer, the term of this patent is extended or adjusted under 35 U.S.C. 154(b) by 472 days.

(21) Appl. No.: 14/567,953

(22) Filed: Dec. 11, 2014

(65) Prior Publication Data

US 2015/0168638 A1    Jun. 18, 2015

(30) Foreign Application Priority Data

Dec. 18, 2013    (JP) .................... 2013-261344

(51) Int. Cl.
  *F21V 7/04*    (2006.01)
  *F21V 8/00*    (2006.01)
  (Continued)

(52) U.S. Cl.
  CPC ............ *G02B 6/0073* (2013.01); *H01L 33/20* (2013.01); *H01L 33/0062* (2013.01); *H01L 33/48* (2013.01); *H01L 33/50* (2013.01)

(58) Field of Classification Search
  CPC ... G02B 6/0073; H01L 33/20; H01L 33/0062; H01L 33/48; H01L 33/50; H01L 33/02;
  (Continued)

(56) References Cited

U.S. PATENT DOCUMENTS 6,835,958 B2    12/2004    Uemura
7,947,995 B2    5/2011    Muraki et al.
(Continued)

FOREIGN PATENT DOCUMENTS

CN    102916091 A    2/2013
JP    2002-117702 A    4/2002
(Continued)

OTHER PUBLICATIONS

Japanese Office Action dated Oct. 4, 2016 with a partial English translation thereof.
(Continued)

*Primary Examiner* — Anh Mai
*Assistant Examiner* — Meghan Ulanday
(74) *Attorney, Agent, or Firm* — McGinn I. P. Law Group, PPLC.

(57) ABSTRACT

A planar light source comprises a light guide plate and a light-emitting apparatus disposed on a lateral surface of the light guide plate. The light-emitting apparatus comprises a light-emitting device, a case, and a sealing resin. The light-emitting device has a rectangular shape in a plan view, a long-side lateral surface of a semiconductor layer is reversed tapered having an inclination such that a cross section area increases in a direction parallel to a main surface of a sapphire substrate as a distance from the sapphire substrate increases, and a short-side lateral surface is perpendicular to the main surface of the sapphire substrate. A short-side and a long-side direction of the light-emitting device are perpendicular and parallel to the planar main surface of the light guide plate, respectively. The main surface of the light-emitting device is parallel to the lateral surface of the light guide plate.

3 Claims, 5 Drawing Sheets

(51) Int. Cl.
  *H01L 33/20* (2010.01)
  *H01L 33/00* (2010.01)
  *H01L 33/48* (2010.01)
  *H01L 33/50* (2010.01)

(58) Field of Classification Search
  CPC .... F21V 9/30; F21V 2200/20; F21Y 2105/00; F21Y 2105/16; F21Y 2115/10
  USPC .......................................................... 362/611
  See application file for complete search history.

(56) References Cited

U.S. PATENT DOCUMENTS

| | | | |
|---|---|---|---|
| 2003/0160259 A1 | 8/2003 | Uemura | |
| 2004/0026700 A1 | 2/2004 | Akaike et al. | |
| 2008/0173883 A1* | 7/2008 | Hussell | G02B 6/0073 257/98 |
| 2010/0176418 A1 | 7/2010 | Muraki et al. | |
| 2012/0162984 A1* | 6/2012 | Fujimori | H01L 33/60 362/235 |

FOREIGN PATENT DOCUMENTS

| | | |
|---|---|---|
| JP | 2003-234504 A | 8/2003 |
| JP | 2003-298107 A | 10/2003 |
| JP | 2006-128659 A | 5/2006 |
| JP | 2006-128719 A | 5/2006 |
| JP | 2006-339551 A | 12/2006 |
| JP | 2008-108994 A | 5/2008 |
| JP | 2008-124254 A | 5/2008 |

OTHER PUBLICATIONS

Chinese Office Action, dated Jan. 3, 2017, and English translation thereof.
Japanese Office Action, dated Feb. 28, 2017, and Partial English translation thereof.
Japanese Office Action, dated Jun. 27, 2017, in Japanese Patent Application No. 2013-261344 and English Translation thereof.

* cited by examiner

PLANAR LIGHT SOURCE AND METHOD FOR PRODUCING LIGHT-EMITTING DEVICE

BACKGROUND OF THE INVENTION

Field of the Invention

The present invention relates to a planar light source combining a light guide plate and a light-emitting apparatus, wherein a light coming from the light-emitting apparatus is introduced into the light guide plate through a lateral surface of the light guide plate and is emitted from a top surface of the light guide plate. More particularly, the present invention resides in a light-emitting apparatus employing a Group III nitride semiconductor light-emitting device. The present invention also relates to a method for producing a Group III nitride semiconductor light-emitting device.

Background Art

A planar light source combining a light guide plate and a light-emitting apparatus has been widely known, for example, from Japanese Patent Application Laid-Open (kokai) No. 2008-108994. In such a light source, the light-emitting apparatus is disposed on a lateral surface of the light guide plate made of transparent resin such as acrylic resin, a light from the light-emitting apparatus is incident through the lateral surface of the light guide plate in the light guide plate, the light is reflected inside the light guide plate and is extracted from a top surface of the light guide plate so that light is emitted in a planar shape. Especially, a planar light source employing a blue light-emitting device made of Group III nitride semiconductor and a white light-emitting apparatus having a sealing resin containing fluorescent material sealing the light-emitting device, has often been employed in, for example, a backlight of a liquid crystal display.

On the other hand, Japanese Patent Application Laid-Open (kokai) 2008-124254 discloses a Group III nitride semiconductor light-emitting device having a quadrangle shape in a plan view, wherein long-side lateral surfaces are reversed tapered (the lateral surfaces are inclined such that the cross section area of a plane parallel to the substrate main surface increases as the distance from the substrate increases), and short-side lateral surfaces are perpendicular to the substrate main surface.

However, in the conventional planar light source combining the light guide plate and the light-emitting apparatus, the rate of light from the light-emitting apparatus taken inside the light guide plate is not sufficient. Accordingly, there remains room for further improvement in the light output from the planar light source.

There is no specific description about the orientation characteristics of the light-emitting device disclosed in Japanese Patent Application Laid-Open (kokai) 2008-124254. There is also no description of the structure of the planar light source combining the light-emitting apparatus employing these light-emitting devices and the light guide plate.

SUMMARY OF THE INVENTION

In view of the foregoing, an object of the present invention is to provide a planar light source combining a light guide plate and a light-emitting apparatus, which exhibits improved light output, and a method for producing a light-emitting device suitable for such a light-emitting apparatus.

In the present invention, there is provided a planar light source comprising a light guide plate and a light-emitting apparatus which is disposed on a lateral surface of the light guide plate and emits white light toward the lateral surface, wherein light from the light-emitting apparatus is incident in the light guide plate through the lateral surface thereof, and the light is emitted from a planar main surface of the light guide plate. The light-emitting apparatus comprising: a light-emitting device emitting a blue light comprising a substrate and a Group III nitride semiconductor layer disposed on a main surface of the substrate; a case having a concave portion housing the light-emitting device therein; and a sealing resin filling the concave portion to seal the light-emitting device and being mixed with yellow fluorescent material. wherein the light-emitting device has a rectangular shape in a plan view, a long-side lateral surface of the semiconductor layer is reversed tapered having an inclination such that a cross section area increases in a plane parallel to the main surface of the substrate as a distance from the main surface increases, a short-side lateral surface is perpendicular to the main surface of the substrate, or is forward tapered having an inclination such that the cross section area decreases in a plane parallel to the main surface of the substrate as the distance from the main surface increases. And wherein the light-emitting apparatus is disposed with respect to the light guide plate so that the short-side direction of the light-emitting device is perpendicular to the planar main surface of the light guide plate, the long-side direction of the light-emitting device is parallel to the planar main surface of the light guide plate, and the direction perpendicular to the main surface of the substrate of the light-emitting device is perpendicular to the lateral surface of the light guide plate.

The long-side lateral surface of the light-emitting device is preferably inclined by 5° to 85° to the substrate main surface. When the inclination angle of the long-side lateral surface falls within this range, light emitting from the light-emitting device is suppressed from being diffused in a direction perpendicular to the planar main surface of the light guide plate, thereby making light incident more efficiently in the light guide plate.

The light guide plate may have a thickness one to fifteen times the width in the short-side direction of the opening of the concave portion of the case. Even if the thickness of the light guide plate falls within this range, the planar light source of the present invention achieves light output equivalent to that when the long-side lateral surface of the light-emitting device is not reversed tapered but perpendicular. Therefore, the size of the planar light source can be reduced.

In the present invention, there is also provided a method for producing a light-emitting device having a Group III nitride semiconductor layer on a main surface of a substrate. The method comprises forming only long side grooves among element separation grooves which are formed in a rectangular lattice pattern for partitioning the semiconductor layer into a plurality of elements after the formation of the semiconductor layer and wet etching a lateral surface of the semiconductor layer exposed in the long side grooves to be reversed tapered having an inclination such that a cross section area increases in a plane parallel to the main surface of the substrate as the distance from the substrate increases.

The processes are preferably as follows. In the forming only long side grooves, the grooves are formed by laser processing, and a modified portion is formed in an area of the semiconductor layer which area is near the substrate. In the wet etching, the lateral surfaces of the semiconductor layer are reversed tapered with the modified portion as a starting point of wet etching. Thus, the lateral surfaces of the semiconductor layer can be easily reversed tapered.

In the planar light source of the present invention, light emitted from the light-emitting apparatus is efficiently incident in the light guide plate, thereby improving the light output. Through the method for producing the light-emitting device of the present invention, the light-emitting device suitable for the planar light source of the present invention can be produced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawing, in which.

DETAILED DESCRIPTION OF PREFERRED EMBODIMENT

A specific embodiment of the present invention will next be described with the reference to the drawings. However, the present invention is not limited to the embodiment.

Embodiment 1

Figure 1:
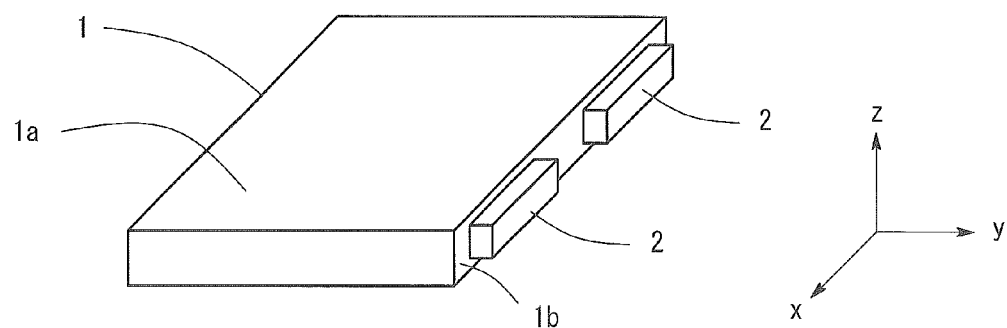
FIG. 1 shows the structure of a planar light source according to Embodiment 1.

FIG. 1 shows the structure of a planar light source according to Embodiment 1. As shown in FIG. 1, a planar light source according to Embodiment 1 comprises a light guide plate 1 and a light-emitting apparatus 2.

The light guide plate 1 has a rectangular planar shape made of resin transparent to visible light, such as acrylic resin, polycarbonate resin, and cycloolefin polymer resin.

A plurality of light-emitting apparatuses 2 is disposed along a lateral surface 1b of the light guide plate 1. The light-emitting apparatus 2 is a light source which has a long rectangular shape and emits white light. The light-emitting apparatus 2 is disposed so as to emit light toward the lateral surface of the light guide plate 1. A light from the light-emitting apparatus 2 is incident in the light guide plate 1, the light is multi-reflected inside the light guide plate 1, and extracted from an entire top surface 1a of the light guide plate 1 while being guided toward the opposite lateral surface, and thus the light is emitted in a planar shape.

The light guide plate 1 may have various structures conventionally employed to improve in-plane emission uniformity or light extraction. For example, at least following one can be applied. Irregularities are formed on the rear surface of the light guide plate 1 (the main surface opposite to the top surface 1a), reflectors are provided on the rear surface, the rear surface of the light guide plate 1 is inclined, or a light diffusion sheet is provided on the top surface 1a. Moreover, light-emitting apparatuses 2 may be disposed on two or more lateral surfaces of the light guide plate 1 instead of only one lateral surface of the light guide plate 1.

Figure 2A:
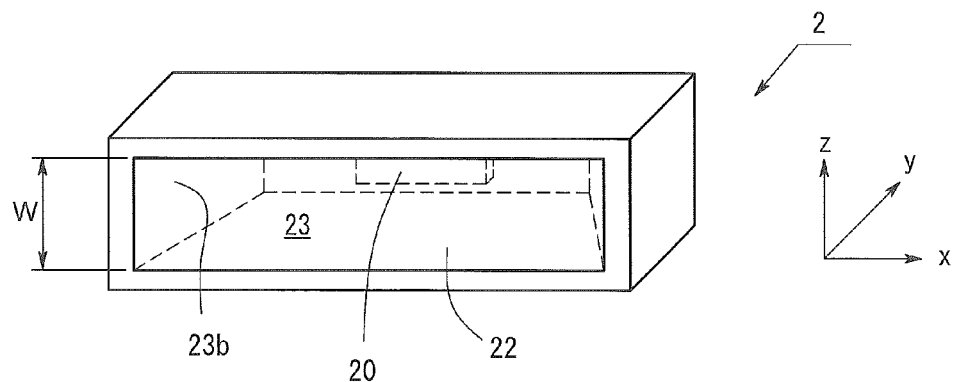
FIGS. 2A, 2B, and 2C show the structure of a light-emitting apparatus 2.
Figure 2B:
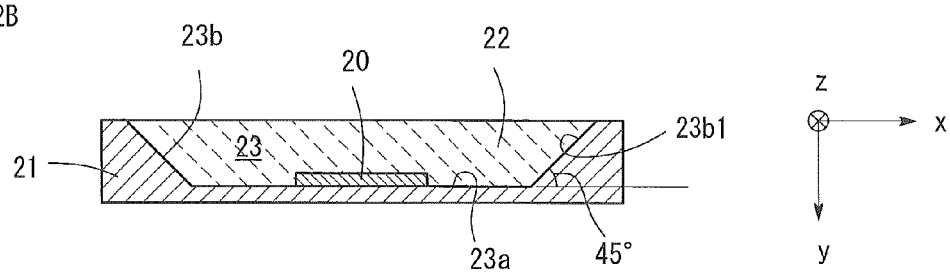
Figure 2C:
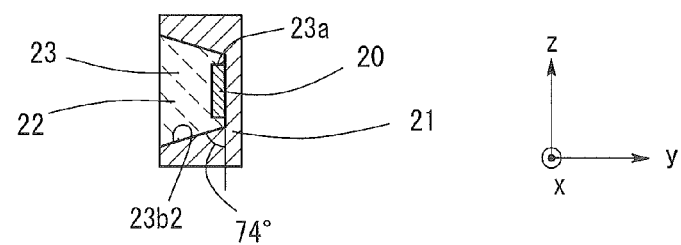

Next will be described the structure of the light-emitting apparatus 2. FIGS. 2A to 2C show the structure of the light-emitting apparatus 2. FIG. 2A is a perspective view of the light-emitting apparatus 2. The light-emitting apparatus 2 has a rectangular shape as shown in FIG. 2A. FIG. 2B is a cross section of x-y plane, and FIG. 2C is a cross section of y-z plane. Here the x-axis is defined as the long-side direction of the light-emitting apparatus 2 and the long-side direction of the lateral surface 1b of the light guide plate 1, the y-axis is defined as a direction perpendicular to the x-axis and perpendicular to the lateral surface 1b of the light guide plate 1, the z-axis is defined as the short-side direction of the light-emitting apparatus 2 and the short-side direction of the lateral surface 1b of the light guide plate 1.

As shown in FIGS. 2A to 2C, the light-emitting apparatus 2 comprises a blue light-emitting device 20 made of Group III nitride semiconductor, a case 21 for housing the light-emitting device 20, and a sealing resin 22.

The case 21 has a rectangular parallelepiped shape, and has a long rectangular concave 23 on a long-side lateral surface along the long-side direction, i.e., x-axis. The light-emitting device 20 is mounted on a bottom surface 23a of the concave 23. A lead frame (not illustrated) formed on the bottom surface of the concave 23 is connected with the light-emitting device 20. The case 21 is formed of resin such as polyimide mixed with white pigment or liquid crystal polymer, and integrally formed with the lead frame.

An inclination (forward taper) is formed on the four lateral surfaces 23b of the concave 23 such that the cross section area increases in a horizontal direction parallel to the bottom surface 23a of the concave 23 as the distance from the bottom surface 23a increases. This inclination efficiently directs the light emitted from the light-emitting device 20 to the opening of the concave 23. When an inclination angle is defined as the angle between any one of the four lateral surfaces 23b and the bottom surface 23a, the inclination angle of the short-side lateral surface 23b1 is 45° and the inclination angle of the long-side lateral surface 23b2 is 74°. Larger the inclination angle, the lateral surface 23b is more closing to a plane perpendicular to the bottom surface 23a of the concave 23v. Such an inclination angle of the long-side lateral surface 23b2 allows efficient diffusion of light in a horizontal direction (in a plane parallel to the x-y plane), thereby reflecting the light toward the opening of the concave 23. Moreover, by setting the inclination angle of the long-side lateral surface 23b2 larger than that of the short-side lateral surface 23b1, the light is prevented from diffusing in a direction perpendicular to the main surface of the light guide plate 1, i.e., z-axis, (in a plane parallel to the y-z plane) and can be reflected toward the opening. Since the light is not diffused in a direction perpendicular to the main surface of the light guide plate 1, the light from the light-emitting apparatus 2 can be efficiently incident in the light guide plate 1.

The inclination angles of the short-side lateral surface 23b1 and the long-side lateral surface 23b2 are not limited to the above values. The inclination angle of the long-side lateral surface 23b2 may be 30° to 90°, more preferably 60° to 90°. The inclination angle of the short-side lateral surface 23b1 may be 15° to 75°, more preferably, 30° to 60°.

The concave 23 of the case 21 is filled with the sealing resin 22, and thus the light-emitting device 20 is sealed. The sealing resin 22 is, for example, silicone resin, epoxy resin, and fluoride resin. The sealing resin 22 is mixed with yellow fluorescent material or dispersing agent. This yellow fluorescent material converts a part of blue light emitted from the light-emitting device 20 into yellow light, and the mixture of blue light and yellow light results in a white light emission from the light-emitting apparatus 2. The mixture of dispersing agent allows uniform light emission of the light-emitting apparatus 2.

Figure 3:
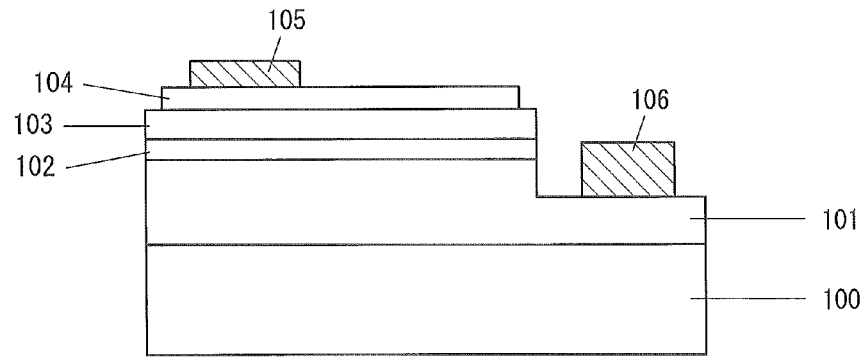
FIG. 3 is a cross-sectional view of the structure of a light-emitting device 20.
Figure 4:
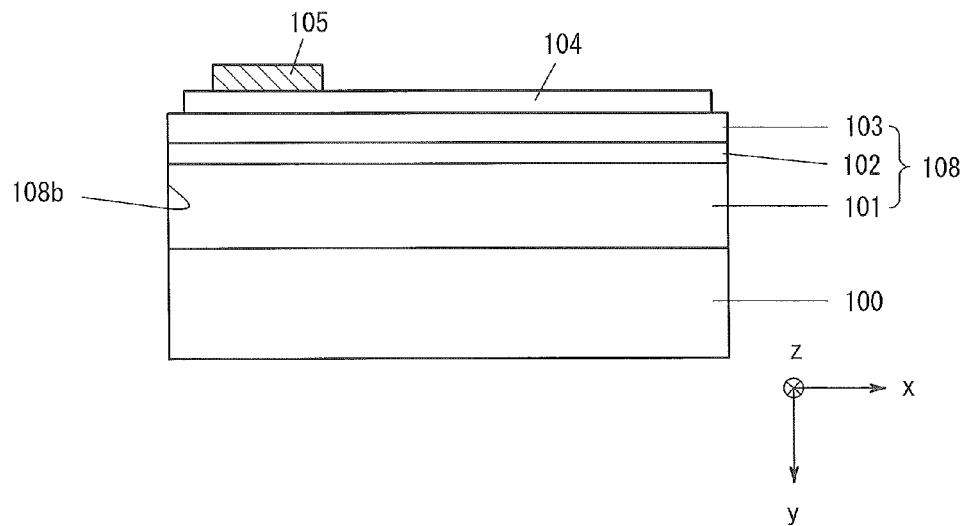
FIG. 4 is a side view of the structure of the light-emitting device 20.
Figure 5:
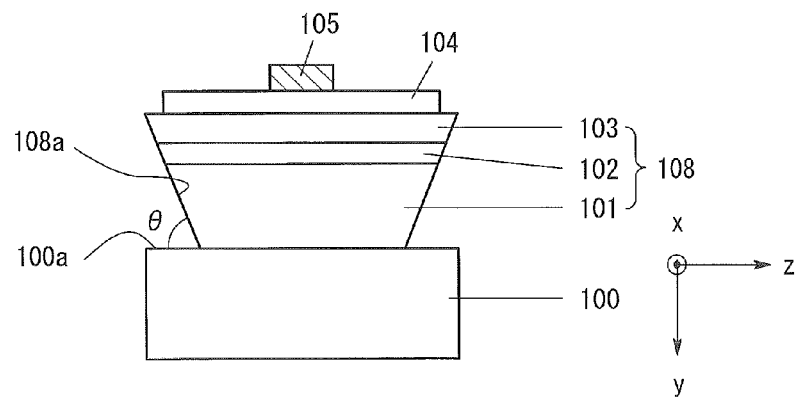
FIG. 5 is a side view of the structure of the light-emitting device 20.

The structure of the light-emitting device 20 will next be described in detail. FIGS. 3 to 5 show the structure of the light-emitting device 20. The light-emitting device 20 has a rectangular shape in a plan view. The ratio of the long side length to the short side length is, for example, 2 to 5. FIG. 3 is a cross-section, FIG. 4 is a side view of the long side, and FIG. 5 is a side view of the short side. As shown in FIG. 3, the light-emitting device 20 comprises a sapphire substrate 100; an n-type layer 101, a light-emitting layer 102, and a p-type layer 103, which are sequentially deposited on the sapphire substrate 100, each of which is formed of Group III nitride semiconductor; a transparent electrode 104 on the p-type layer; and a p-electrode 105 on the transparent electrode 104, and an n-electrode 106.

The sapphire substrate 100 has a c-plane main surface, the long-side direction thereof is an a-axis direction and the short-side direction thereof is a m-axis direction. That is, the long-side lateral surface of the sapphire substrate 100 is an m-plane, and the short-side lateral surface is a a-plane. Irregularities may be formed on the surface of the sapphire substrate 100 to improve light extraction.

A semiconductor layer 108 (the n-type layer 101, the light-emitting layer 102, and the p-type layer 103) may have any structure conventionally known as the structure of the Group III nitride semiconductor light-emitting device. For example, it may have the following structure. The n-type layer 101 has a layered structure in which an n-contact layer, an ESD layer, and an n-cladding layer are sequentially deposited on the sapphire substrate 100. The n-contact layer is formed of n-GaN having a Si concentration of $1 \times 10^{18}/cm^3$ or more, the ESD layer has a layered structure of undoped GaN and Si-doped n-GaN, and the n-cladding layer has a superlattice structure in which a plurality of layer units is repeatedly deposited, each layer unit comprising InGaN, GaN, and n-GaN sequentially deposited. The light-emitting layer 102 has a MQW structure in which an InGaN well layer and an AlGaN barrier layer are alternately and repeatedly deposited. The p-type layer 103 has a structure in which a p-cladding layer and a p-contact layer are sequentially deposited on the sapphire substrate 100. The p-cladding layer has a structure in which a plurality of layer units is repeatedly deposited, each layer unit comprising p-InGaN and p-AlGaN sequentially deposited. The p-contact layer is formed of p-GaN having a Mg concentration of $1 \times 10^{19}/cm^3$ to $1 \times 10^{22}/cm^3$.

In the semiconductor layer 108, the long-side direction is the m-axis direction, the short-side direction is the a-axis direction, and the short-side lateral surface 108b is the m-plane. As shown in FIG. 5, the long-side lateral surface 108a is reversed tapered. As used herein, "reversed tapered" means a shape that the cross section area, which is parallel to the main surface 100a of the sapphire substrate 100, increases as the distance from the sapphire substrate 100 increases. The long-side lateral surface 108a is inclined by approx. 45° (angle θ of FIG. 5) with respect to the main surface 100a of the sapphire substrate 100. The angle θ between the long-side lateral surface 108 and the main surface 100a of the sapphire substrate 100 is defined as an inclination angle. By making the long-side lateral surface 108a such reversed tapered, light emitted from the light-emitting device 20 is suppressed from diffusing in the short-side direction, i.e., z-axis. On the other hand, as shown in FIG. 4, the short-side lateral surface 108b is perpendicular to the main surface 100a of the sapphire substrate 100.

The transparent electrode 104 is formed on almost the entire top surface of the p-type layer 103. The transparent electrode 104 is formed of a conductive material transparent to the light emission wavelength, such as ITO, IZO (zinc-doped oxide indium), and ICO (cerium-doped oxide indium).

The p-electrode 105 is formed on the transparent electrode 104, and comprises a pad portion to be connected with a bonding wire and a wiring portion extending in a wiring pattern to diffuse current in a plane. A part of the semiconductor layer 108 is removed to form a groove, and the n-type layer 101 is exposed at the bottom surface of the groove. The n-electrode 106 is formed on the exposed n-type layer 101. The n-electrode 106 also comprises a pad portion and a wiring portion similar to the p-electrode 105.

The positional relation between the light guide plate 1 and the light-emitting apparatus 2, and between the light-emitting apparatus 2 and the light-emitting device 20 will next be described in detail. Firstly, the positional relation between the light-emitting apparatus 2 and the light-emitting device 20 will be described. The light-emitting device 20 is disposed in the following direction on the bottom surface 23a of the case 21. As shown in FIG. 2, the light-emitting device 20 is disposed on the bottom surface 23a of the case 21 so that the main surface of the light-emitting device 20, i.e., a back surface of the sapphire substrate 100, is brought into contact with the bottom surface 23a of the case 21, the long-side direction of the light-emitting device 20 is aligned with the long-side direction of the light-emitting apparatus 2, and the short-side direction of the light-emitting device 20 is aligned with the short-side direction of the light-emitting apparatus 2. The both of the long-side directions are parallel to the x-axis and the both of the short-side directions are parallel to the z-axis. By disposing the light-emitting device 20 in the case 21 in this way, light emitted from the light-emitting apparatus 2 is prevented from diffusing in the short-side direction of the light-emitting apparatus 2 (z-axis direction of FIGS. 2A to 2C).

The positional relation between the light guide plate 1 and the light-emitting apparatus 2 will next be described. The light-emitting apparatus 2 is disposed in the following direction with respect to the light guide plate 1. As shown in FIG. 1, a light-emitting surface (a surface of the opening of the concave 23) of the light-emitting apparatus 2 faces the lateral surface 1b of the light guide plate 1 so that the light-emitting surface of the light-emitting apparatus 2 is disposed in parallel to the lateral surface 1b of the light guide plate 1. In addition, the short-side direction of the light-emitting apparatus 2 is aligned with a direction perpendicular to the main surface 1a of the light guide plate 1 (z-axis direction of FIG. 1 and FIGS. 2A to 2C), and the long-side direction of the light-emitting apparatus 2 is aligned with the long-side direction of the lateral surface 1b of the light guide plate 1 (x-axis direction of FIG. 1 and FIGS. 2A to 2C).

As a result of such disposition between the light guide plate 1 and the light-emitting apparatus 2, and between the light-emitting apparatus 2 and the light-emitting device 20, the light guide plate 1 and the light-emitting device 20 are arranged in the following relation. The short-side direction of the light-emitting device 20 coincides with a direction perpendicular to the surface 1a of the light guide plate 1 (z-axis direction of FIG. 1 and FIGS. 2A to 2C). The long-side direction of the light-emitting device 20 coincides with a direction, i.e., x-axis, parallel to the surface 1a of the light guide plate 1 (a direction in x-y plane of FIG. 1 and FIGS. 2A to 2C). A direction perpendicular to the main surface of the light-emitting device 20 coincides with a direction perpendicular to the lateral surface 1b of the light guide plate 1 (y-axis direction of FIG. 1 and FIGS. 2A to 2C).

Since light emitted from the light-emitting apparatus 2 is suppressed from diffusing in a direction perpendicular to the main surface 1a of the light guide plate 1 by such disposition, light can be efficiently incident through the lateral surface 1b of the light guide plate 1 in the light guide plate 1. Therefore, the planar light source can achieve a high output.

Since the light is suppressed from diffusing in a direction perpendicular to the main surface 1a of the light guide plate 1, the width of the short side of the concave 23 of the case 21 (width W of z-axis direction) can be reduced. Moreover, the light guide plate 1 can be reduced in thickness. Thus, the planar light source according to Embodiment 1 can be reduced in size and thickness than the conventional planar light source.

Particularly, the thickness of the light guide plate 1 can be reduced within one to fifteen times the width W of the short side of the opening of the concave 23. Even if the thickness of the light guide plate 1 is reduced, the same output as that of the conventional one can be ensured.

Next will be described processes for producing the light-emitting device 20.

Figure 6A:
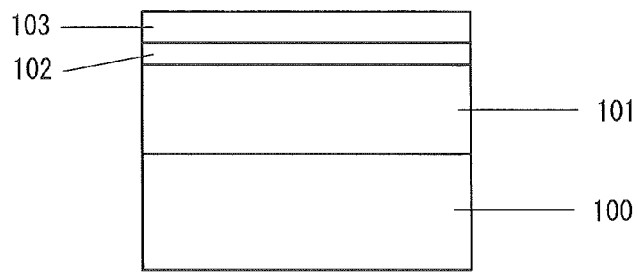
FIGS. 6A, 6B, and 6C are sketches showing processes for producing the light-emitting device 20.

Firstly, an n-type layer 101, a light-emitting layer 102, and a p-type layer 103 are sequentially deposited on a sapphire substrate 100 through MOCVD (refer to FIG. 6A).

The raw material gases employed are as follows: TMG (trimethylgallium) as a Ga source, TMA (trimethylaluminum) as an Al source, TMI (trimethylindium) as an In source, ammonia as an nitrogen source, biscyclopentadienylmagnesium as a p-type dopant gas, and silane as an n-type dopant gas. Hydrogen and nitrogen are employed as a carrier gas.

Figure 6B:
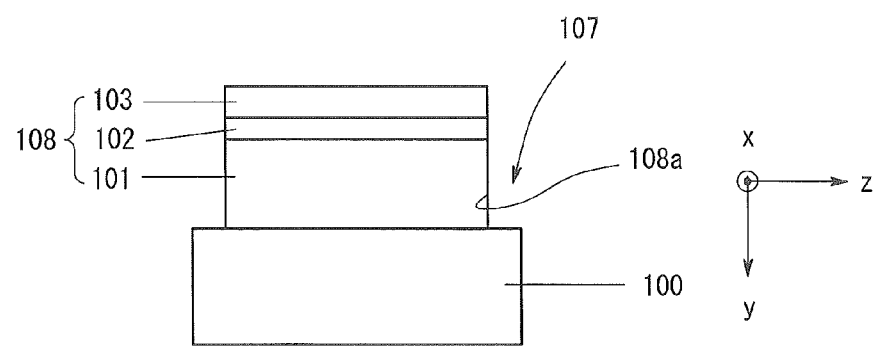

Subsequently, a groove 107 is formed by laser processing along the long-side direction, i.e., the x-axis direction, of the light-emitting device 20 (refer to FIG. 6B). Laser wavelength absorbs the Group III nitride semiconductor. For example, a KrF laser with a wavelength of 248 nm or an ArF laser with a wavelength of 193 nm may be employed. The groove 107 is formed so as to have a depth passing through the p-type layer 103, the light-emitting layer 102, and the n-type layer 101 and reaching the sapphire substrate 100. This groove 107 also serves as long side grooves of element separation grooves in a lattice pattern formed to partition and separate the semiconductor layer 108 (the n-type layer 101, the light-emitting layer 102, and p-type layer 103) into each light-emitting device. At this stage, short side grooves of the element separation grooves are not formed. The long-side direction is a m-axis direction, and the lateral surface 108a of the semiconductor layer 108 exposed by the groove 107 is an a-plane.

Next, the lateral surface 108a of the semiconductor layer 108 exposed at the lateral surface of the groove 107 is wet etched at a temperature of 200° C. for 10 minutes, using phosphoric anhydride.

Here, a c-plane is hardly etched in wet etching using phosphoric acid, however, an a-plane is etched, and a m-plane is difficult to be etched. Since the crystallinity of the semiconductor layer 108 is improved with the progress of deposition, the crystallinity is lower as closer to the sapphire substrate 100, and the crystallinity is higher as more distant from the sapphire substrate 100.

Therefore, the etching rate is higher in a region closer to the sapphire substrate 100, and the etching rate is lower in a region more distant from the sapphire substrate 100. Particularly, when a sapphire substrate 100 having irregularities on the semiconductor layer 108 is employed, the crystallinity of the semiconductor layer 108 closer to the sapphire substrate 100 is further deteriorated, and the etching rate is increased, which is preferable.

Figure 6C:
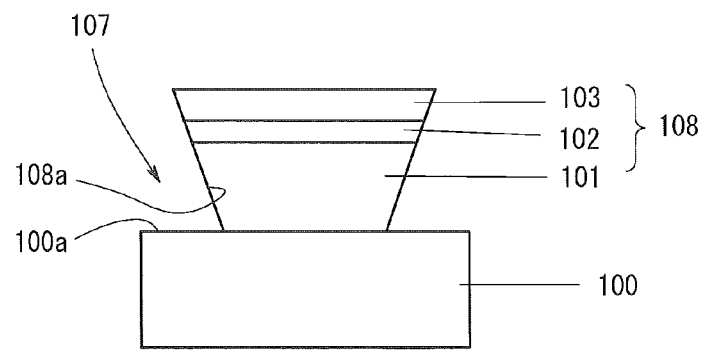

As a result, the long-side lateral surface 108a of the semiconductor layer 108 is etched to be reversed tapered having an inclination such that the cross section area increases in a plane parallel to the main surface 100a of the sapphire substrate 100 as the distance from the sapphire substrate 100 increases (FIG. 6C). The long-side lateral surface 108a is inclined by 45° to the main surface 100a of the sapphire substrate 100. Through the wet etching using phosphoric acid, a crystal surface having a specific orientation appears on the long-side lateral surface 108a.

Since short side grooves of the element separation grooves are not formed in this wet etching, the short-side lateral surface 108b of the semiconductor layer 108 is not reversed tapered.

A strong alkaline solution such as KOH (potassium hydroxide), NaOH (sodium hydroxide), and TMAH (Tetramethylammonium hydroxide) other than phosphoric acid may be used for wet etching the Group III nitride semiconductor.

A groove 107 is formed in the m-axis direction, the a-plane is exposed as the lateral surface 108a of the semiconductor layer 108 being a lateral surface of the groove 107, and then a-plane is wet etched. However, a plane other than a-plane may be exposed. A plane to be exposed is preferable other than m-plane because the m-plane is difficult to be etched.

Figure 9:
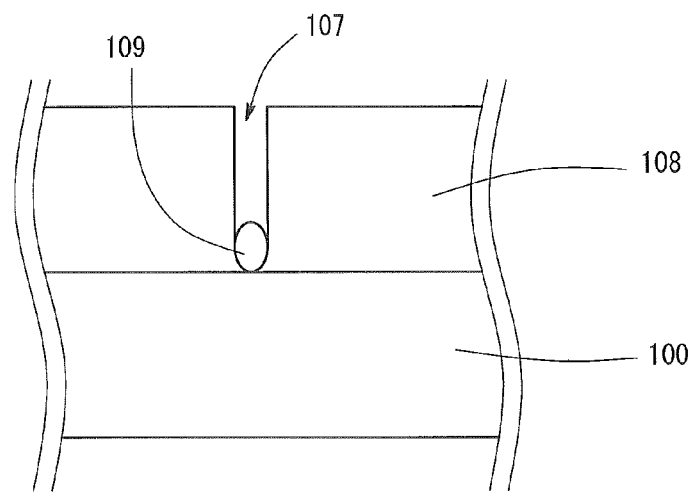
FIG. 9 is a sketch showing a part of processes for producing the light-emitting device 20.

When forming the groove 107 by laser processing, preferably a modified portion 109 is generated near the sapphire substrate 100 of the semiconductor layer 108 (refer to FIG. 9). The modified portion 109 is amorphous sapphire, and the crystallinity is poor. Therefore, etching is easier with the modified portion 109 as a starting point, and the long-side lateral surface 108a of the semiconductor layer 108 is easily etched to be reversed tapered.

Next, a transparent electrode 104 is formed through sputtering or vacuum deposition on a specific region of the p-type layer 103. A portion of the surface of the p-type layer 103 is dry etched and a groove reaching the n-type layer 101 is formed. The n-type layer 101 is exposed at the bottom surface of the groove. Subsequently, a p-electrode 105 is formed through vacuum deposition on the transparent electrode 104, and an n-electrode 106 is formed on the n-type layer 101 exposed at the bottom surface of the groove. After that, short side grooves as the element separation grooves are formed, the long side grooves 107 are also the element separation grooves, and separated along the element separation grooves into each light-emitting device by laser dicing and other method. Through the above processes, the light-emitting device 20 shown in FIGS. 3 to 5 is manufactured.

In the above processes for producing the light-emitting device 20, the process of forming the groove 107 and the process of wet etching are performed after the formation of the p-type layer 103 and before the formation of the transparent electrode 104. These processes may be performed any time after the formation of the p-type layer 103 and before the process of separating the elements. For example, it may be performed just after the process of forming the electrode. The long side groove 107 also serves as one of the element separation grooves. It may be formed separately from the element separation grooves.

Figure 7:
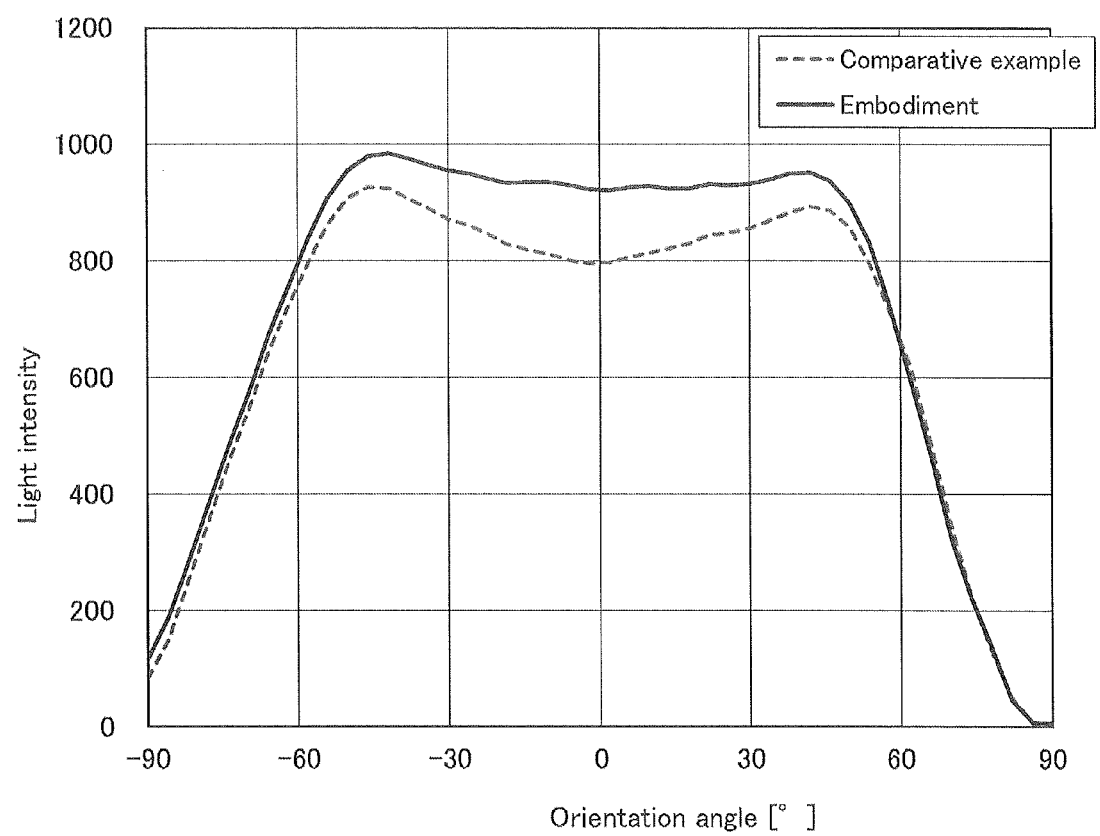
FIG. 7 is a graph showing the optical orientation characteristics of the light-emitting device 20.

FIG. 7 is a graph showing the orientation characteristics of light output from light-emitting device 20 according to Embodiment 1. As a comparative example, the orientation characteristics of a light-emitting device whose long-side lateral surface is perpendicular to the main surface 100a of the sapphire substrate 100 without tapering the long-side lateral surface 108a of the semiconductor layer 108, are also measured and shown in FIG. 7. In FIG. 7, the horizontal axis represents the orientation angle between the optical axis of the output light and the direction perpendicular to the main surface 100a of the sapphire substrate 100. The vertical axis represents the output light intensity.

As is clear from FIG. 7, by providing a reversed tapered inclination on the long-side lateral surface 108a of the light-emitting device 20, the light intensity is higher within an orientation angle range of −45° to 45° than that of the light-emitting device of the comparative example, and the upward light output is higher than that of the light-emitting device of the comparative example.

Thus, the planar light source according to Embodiment 1 can improve the light output because the light from the light-emitting apparatus 2 is efficiently incident in the light guide plate 1.

In the planar light source according to Embodiment 1, the light guide plate 1 has a rectangular planar shape. Needless to say, it may be a flat plate having any shape such as square, rhombus, and half-circle.

In Embodiment 1, the inclination angle θ between the long-side lateral surface 108a and the main surface 100a of the sapphire substrate 100 is 45°, but it is not limited to this as long as it falls within a range of 5° to 85°. When the inclination angle θ is within this range, light emitted from the light-emitting device 20 can be efficiently suppressed from diffusing in the short-side direction. More preferable, the inclination angle is within a range of 30° to 75°.

Figure 8:
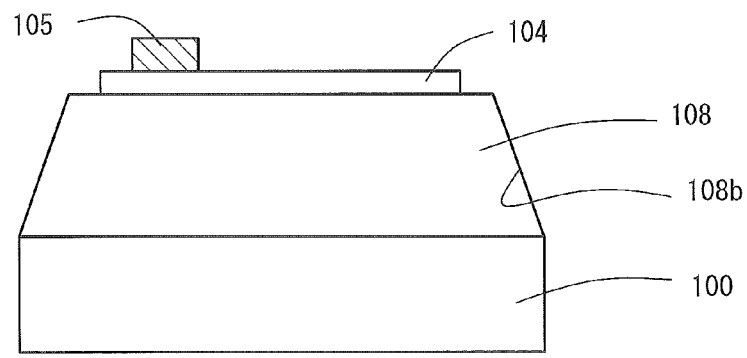
FIG. 8 is a side view of the structure of other light-emitting device 20.

In Embodiment 1, the short-side lateral surface 108b is perpendicular to the main surface 100a of the sapphire substrate 100, but it is not limited to this. It may be inclined in a forward tapered shape (refer to FIG. 8). Here, "forward taper" means that the short-side lateral surface 108b has an inclination such that the cross section area decreases in a plane parallel to the main surface 100a of the sapphire substrate 100 as the distance from the sapphire substrate 100 increases.

When the short-side lateral surface 108b is forward tapered, forward taper processing is preferably performed before the long-side lateral surface 108a is processed for the reversed tapered inclination. That is, the short-side lateral surface 108b is forward tapered by dry etching the short side grooves before forming the long side grooves as the element separation grooves. Thereafter, through the processes shown in Embodiment, the long-side lateral surface 108a is reversed tapered.

The entire surface of the long-side lateral surface 108a of the semiconductor layer 108 need not be reversed tapered. The long-side lateral surface 108a of the semiconductor layer 108 may be reversed tapered until it reaches a specific height h (a distance from the main surface 100a of the sapphire substrate 100 in a direction perpendicular to that surface 100a), and when it exceeds a specific height h, it may be perpendicular or forward tapered (refer to FIG. 10). The height h is that of any point in the n-type layer 101 of the semiconductor layer 108.

Figure 10:
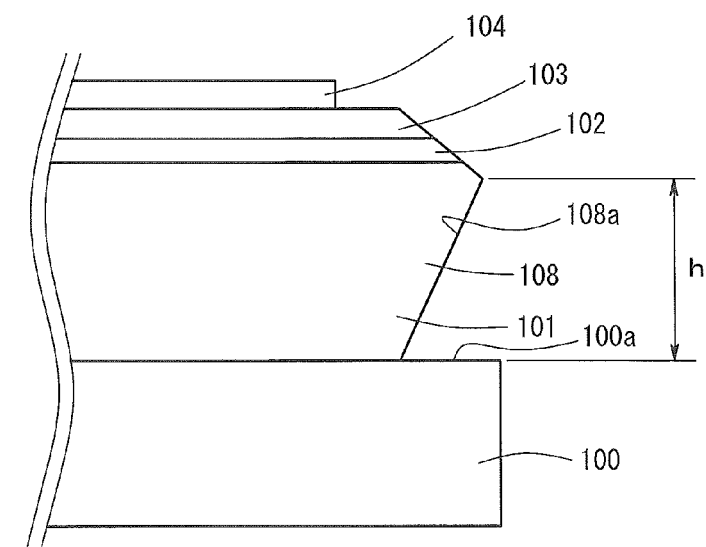
FIG. 10 is a side view of the structure of another light-emitting device 20.

Such shape can be formed, for example, by the following processes. Firstly, the long side groove of the element separation grooves is formed by dry etching up to a depth where the height of the semiconductor layer 108 reaches h, and thereby the lateral surfaces of the grooves are forward tapered or perpendicular. It may be formed at the same time as a groove for exposing the n-type layer 101 to form the n-electrode 106. Subsequently, a modified portion is formed near the bottom surface of the groove and near the sapphire substrate 100. Next, wet etching is performed using phosphoric acid. At this time, since the etching rate is high in the modified portion, the lateral surface of the semiconductor layer is reversed tapered with the modified portion as a starting point of wet etching. As a result, the long-side lateral surface 108a can be reversed tapered until reaching the height h, and forward tapered or perpendicular after exceeding the height h as shown in FIG. 10. The light-emitting layer 102 is exposed not in the reversed tapered region but in the forward tapered or perpendicular region of the long-side lateral surfaces 108a. Therefore, the light-emitting layer 102 exposed at the long-side lateral surface 108a can be easily covered with an insulating film, and the reliability of the light-emitting device 20 can be improved.

The planar light source of the present invention can be employed in, for example, a backlight of a liquid crystal display.

What is claimed is:

1. A planar light source comprising a light guide plate and a light-emitting apparatus which is disposed on a lateral surface of the light guide plate and emits white light to the lateral surface, wherein light from the light-emitting apparatus is incident in the light guide plate through the lateral surface thereof, and the light is emitted from a planar main surface of the light guide plate,
   the light-emitting apparatus comprising:
     a light-emitting device emitting a blue light comprising a sapphire substrate and a Group III nitride semiconductor layer disposed on a main surface of the sapphire substrate;
     a case including a concave portion housing the light-emitting device therein, an opening of the case having a rectangular shape in a plan view, and the case having a long-side lateral surface and a short-side lateral surface; and
     a sealing resin filling the concave portion to seal the light-emitting device and being mixed with a yellow fluorescent material,
     wherein the light-emitting device has a rectangular shape in a plan view, a long-side lateral surface of the semiconductor layer is reversed tapered having an inclination such that a cross section area increases in a plane parallel to the main surface of the sa substrate as a distance from the main surface increases, a short-side lateral surface is forward tapered having an inclination such that the cross section area decreases in a plane parallel to the main surface of the sapphire substrate as the distance from the main surface increases,
   wherein the light-emitting apparatus is disposed with respect to the light guide plate so that a short-side direction of the light-emitting device is perpendicular to the planar main surface of the light guide plate, a long-side direction of the light-emitting device is parallel to the planar main surface of the light guide plate, and a direction perpendicular to the main surface of the sapphire substrate of the light-emitting device is perpendicular to the lateral surface of the light guide plate, wherein an inclination angle of the long-side lateral surface of the case is in a range of 60° to 90° and an inclination angle of the short-side lateral surface of the case is in a range of 30° to 60° and the inclination angle of the long-side lateral surface of the case is larger than the inclination angle of the short-side lateral surface, wherein the long-side lateral surface of the light-emitting device is inclined by 30° to 75° to the main surface of the sapphire substrate, and wherein a thickness of the light guide plate is within one to fifteen times of a width of a short side of an opening of the concave of the case.

2. The planar light source according to claim 1, wherein the main surface of the sapphire substrate is a c-plane, the long-side direction is an m-axis direction of the Group III nitride semiconductor layer, and the short-side direction is an a-axis direction of the Group nitride semiconductor layer.

3. A method for producing a light-emitting device including a Group III nitride semiconductor layer on a main surface of a c-plane of a sapphire substrate, the method comprising:

forming long side grooves along an m-axis direction of the Group III nitride semiconductor layer by laser processing as first element separation grooves after formation of the Group III nitride semiconductor layer, a modified portion being formed by the laser processing in an area of the Group III nitride in which is near the sapphire substrate;

wet etching a lateral surface of the Group III nitride semiconductor layer exposed in the long side grooves to be reversed tapered having an inclination angle of 30° to 75° to the main surface such that a cross section area increases in a plane parallel to the main surface as a distance from the sapphire substrate increases, a reversed tapered surface being formed by that the modified portion becomes a starting point of wet etching;

after the wet etching, forming short side grooves along an a-axis direction of the Group III nitride semiconductor layer as second element separation grooves, wherein the first element separation grooves and the second element separation grooves are formed in a rectangular lattice pattern for partitioning the Group III nitride semiconductor layer into a plurality of elements; and separating along the first element separation grooves and the second element separation grooves into each light-emitting device.

* * * * *